(12) United States Patent
Yang

(10) Patent No.: US 6,725,431 B1
(45) Date of Patent: Apr. 20, 2004

(54) LAZY SYMBOLIC MODEL CHECKING

(75) Inventor: Jin Yang, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 709 days.

(21) Appl. No.: 09/608,746

(22) Filed: Jun. 30, 2000

(51) Int. Cl.⁷ .............................................. G06F 17/50
(52) U.S. Cl. ............................................... 716/4; 716/3
(58) Field of Search .............................. 716/4, 5, 6, 3, 716/18; 714/736; 703/2, 15; 706/46; 364/488, 489, 580; 395/183, 500

(56) References Cited

U.S. PATENT DOCUMENTS

| | | | |
|---|---|---|---|
| 5,119,318 A | 6/1992 | Paradies et al. | 395/61 |
| 5,469,367 A | 11/1995 | Puri et al. | 364/489 |
| 5,481,717 A | 1/1996 | Gaboury | 395/700 |
| 5,491,639 A | 2/1996 | Filkorn | 364/488 |
| 5,594,656 A | 1/1997 | Tamisier | 364/488 |
| 5,691,925 A | 11/1997 | Hardin et al. | 364/578 |
| 5,754,454 A | 5/1998 | Pixley et al. | 364/580 |
| 5,768,498 A | 6/1998 | Boigelot et al. | 395/183 |
| 5,905,977 A | 5/1999 | Goubault | 706/46 |
| 5,937,183 A | 8/1999 | Ashar et al. | 395/500 |
| 6,026,222 A | 2/2000 | Gupta et al. | 395/500 |
| 6,035,109 A | 3/2000 | Ashar et al. | 395/500 |
| 6,086,626 A | 7/2000 | Jain et al. | 716/5 |
| 6,131,078 A | 10/2000 | Plaisted | 703/2 |
| 6,148,436 A | 11/2000 | Wohl | 716/18 |
| 6,185,516 B1 | 2/2001 | Hardin et al. | 716/4 |
| 6,209,120 B1 | 3/2001 | Kurshan et al. | 716/5 |
| 6,247,165 B1 | 6/2001 | Wohl et al. | 716/5 |
| 6,292,916 B1 | 9/2001 | Abramovici et al. | 714/736 |
| 6,301,687 B1 | 10/2001 | Jain et al. | 716/3 |
| 6,308,299 B1 | 10/2001 | Burch et al. | 716/4 |
| 6,321,186 B1 | 11/2001 | Yuan et al. | 703/15 |
| 6,339,837 B1 | 1/2002 | Li | 716/5 |
| 6,341,367 B1 | 1/2002 | Downing | 716/16 |

OTHER PUBLICATIONS

Hojati et al.,"Early Quantification and Partitioned Transition Relations", Oct. 1996, Proceedings, IEEE International Conference on Computer Design: VLSI Computers and Processors. pp. 12–19.*

Bradley et al., "Compositional BDD Construction: A Lazy Algorithm", Apr. 1998, Dept of Computer Science, University of Bristo pp. 1–8.*

Burch et al.,"Representing Circuits More Efficiently in Symbolic Model Checking", 1991, 28$^{th}$ ACM/IEEE Design Automation Conference, pp. 403–407.*

Campos, "Symbolic Model Checking in Practice", Oct. 1999, IEEE Proceddings, XII Symposium on Integrated Circuits and System Design, pp. 98–101.*

(List continued on next page.)

Primary Examiner—Leigh M. Garbowski
Assistant Examiner—Sun James Lin
(74) Attorney, Agent, or Firm—Larry M. Mennemeier

(57) ABSTRACT

Methods for formal verification of circuits and other finite-state systems may improve efficiency and capacity of popular binary decision diagram (BDD) based algorithms. A lazy pre-image computation method builds new transition relation partitions on-demand only for relevant next internal variables of a state predicate, and conjoins only next state relations for relevant next internal variables to a pre-image including the state predicate. A lazy backward reachability analysis method makes iterative use of the lazy pre-image computation method to compute the set of states reachable to a given set of states in zero or more transitions. A lazy equivalence checking method makes iterative use of the lazy pre-image computation method to compute conditions that necessarily must be satisfied to disprove equivalence. These methods may provide for symbolic model checking of circuits and other finite state systems previously too large to be completed successfully using BDD based algorithms.

46 Claims, 8 Drawing Sheets

OTHER PUBLICATIONS

Burch et al., "Symbolic Model Checking for Sequential Circuit Verification", Apr. 1994, IEEE Transactions on Computer–Aided Design for Integrated Circuits and Systems, pp. 401–424.*

Zhang, "An Approach to Hierarchy Model Checking via Evaluating CTL Hierarchically", Nov., 1995, IEEE Proceedings of the Fourth Asis Test Symposium, pp. 45–49.*

Berezin, S. et al, "A Compositional Proof System for the Modal $\mu$–Calculus and CCS," *Technical Report CMU–CS–97–105, Carnegie Mellon University*, Jan. 15, 1997.

Berezin, S. et al, "Model Checking Algorithms for the $\mu$–Calculus," *Technical Report CMU–CS–96–180, Carnegie Mellon University*, Sep. 23, 1996.

Bryant, R. E. et al, "Formal Hardware Verification by Symbolic Ternary Trajectory Evaluation," $28^{th}$ *ACM/IEEE Design Automation Conference*, Paper 24.2, 1991, pp. 397–402.

Bryant, R. E., "Binary Decision Diagrams & Beyond," Tutorial at ICCAD '95, *Carnegie Mellon University*, 1995.

Burch, J. R. et al, "Representing Circuits More Efficiently in Symbolic Model Checking," $28^{th}$ *ACM/IEEE Design Automation Conference*, Paper 24.3, 1991, pp. 403–407.

Burch, J. R. et al, "Sequential Circuit Verification Using Symbolic Model Checking," $27^{th}$ *ACM/IEEE Design Automation Conference*, Paper 3.2, 1990, pp. 46–51.

Campos, S., "Real–Time Symbolic Model Checking for Discrete Time Models," *Technical Report CMU–CS–94–146, Carnegie Mellon University, Pittsburgh, PA*, May 2, 1994.

Chan, W. et al, Combining Constraint Solving and Symbolic Model Checking for a Class of Systems with Non–linear Constraints, *Computer Aided Verification, $9^{th}$ International Conference, CAV '97 Proceedings (O. Grumberg, Editor)*, Lecture Notes in Computer Science 1254, pp. 316–327, Haifa, Israel, Jun. 1997. Springer–Verlag (Revised in Dec. '98).

Chen, Y. et al, "PBHD: An Efficient Graph Representation for Floating Point Circuit Verification," *Technical Report CMU–CS–97–134, Carnegie Mellon University*, May 1997.

Cheung, S. et al, "Checking Safety Properties Using Compositional Reachability Analysis," *ACM Transactions on Software Engineering and Methodology*, vol. 8, No. 1, Jan. 1999, pp. 49–78.

Chiodo, M. et al, "Automatic Compositional Minimization in CTL Model Checking," *Proceedings of 1992 IEEE/ACM International Conference on Computer–Aided Design*, Nov., 1992, pp. 172–178.

Chou, C., "The Mathematical Foundation of Symbolic Trajectory Evaluation," *International Conference on Computer–Aided Verification(CAV'99)*, Trento, Italy, Jul. 1999 pp. 196–207, Proceedings of CAV'99, Lecture Notes in Computer Science #1633 (Editors: Nicolas Halbwachs & Doron Peled), Springer–Verlog, 1999.

Clarke, E. et al, "Another Look at LTL Model Checking," *Technical Report CMU–CS–94–114, Carnegie Mellon University*, Feb. 23, 1994.

Clarke, E. et al, "Combining Symbolic Computation and Theorem Proving: Some Problems of Ramanujan," *Technical Report CMU–CS–94–103, Carnegie Mellon University*, Jan. 1994.

Clarke, E. M. et al, "Formal Methods: State of the Art and Future Directions," *ACM Computing Surveys*, vol. 28, No. 4, Dec. 1996, pp. 626–643

Clarke, E. M. et al, "Model Checking and Abstraction," *Proceedings of the $19^{th}$ ACM SIGPLAN–SIGACT Symposium on Principles of Programming Languages*, Feb. 1992, pp. 343–354.

Clarke, E. M. et al, "Model Checking and Abstraction," *ACM Transactions on Programming Languages and Systems*, vol. 16, No. 5, Sep. 1994, pp. 1512–1542.

Grumberg, O., "Model Checking and Modular Verification," *ACM Transactions On Programming Languages and Systems*, vol. 16, No. 3, May 1994, pp. 843–871.

Jackson, D., "Exploiting Symmetry in the Model Checking of Relational Specifications," *Technical Report CMU–CS 94–219, Carnegie Mellon University*, Dec. 1994.

Jain, A. et al, "Verifying Nondeterministic Implementations of Determinist Systems," *Lecture Notes in Computer Science, Formal Methods in Computer Aided–Design*, pp. 109–125, Nov. 1996.

Jain, A., "Formal Hardware Verification by Symbolic Trajectory Evaluation," *Carnegie Mellon University Ph.D. Dissertation*, Jul. 1997.

Jain, S. et al, "Automatic Clock Abstraction from Sequential Circuits," *Proceedings of the $32^{nd}$ ACM/IEEE Conference on Design Automation*, Jan. 1995.

Jha, S. et al, "Equivalence Checking Using Abstract BBDs," *Technical Report CMU–CS–96–187, Carnegie Mellon University, Pittsburgh, PA*, Oct. 29, 1996.

Kern, C. et al, "Formal Verification In Hardware Design: A Survey," *ACM Transactions on Design Automation of Electronic Systems*, vol. 4, No. 2, Apr. 1999, pp. 123–193.

Kurshan, R. et al, "Verifying Hardware in its Software Context," *Proceedings of the $19^{th}$ ACM SIGPLAN–SIGACT Symposium on Principles of Programming Languages*, Feb. 1992, pp. 742–749.

Nelson, K. L. et al, "Formal Verification of a Superscalar Execution Unit," $34^{th}$ *Design Automation Conference*, Jun. 1997.

Tuya, J. et al, "Using a Symbolic Model Checker for Verify Safety Properties in SA/RT Models," *Proceeding of the 5h European Software Engineering Conference, Lecture Notes in Computer Science*, vol. 989, Springer–Verlag, Berlin, 1995, pp. 59–75.

Velev, M. N., "Efficient Modeling of Memory Arrays in Symbolic Simulations," *Proceedings of Computer–Aided Verification*, Jun. 1997.

Wing, J. M. et al, "A Case Study in Model Checking Software Systems," *Technical Report CMU–CS–96–124, Carnegie Mellon University, Pittsburgh, PA*, Apr. 1996.

Yeh, W. et al, "Compositional Reachability Analysis Using Process Algebra," $28^{th}$ *ACM/IEEE Design Automation Conference*, 1991.

* cited by examiner

FIG. 4b

| # of transitions | Front | Transition Relation | Pre-image | Reachable |
|---|---|---|---|---|
| 0 | | [ ] | | e<br><br>420 |
| 1 | e | [ N(e) = e OR c ] | e OR c | e OR c<br><br>421 |
| 2 | c | [ N(e) = e OR c<br>N(c) = c AND a ] | (e OR c)<br>OR<br>(c AND a) | e OR c<br><br>422 |
| 3 | ∅ | [ N(e) = e OR c<br>N(c) = c AND a ] | | e OR c<br><br>423 |

LAZY SYMBOLIC MODEL CHECKING

FIELD OF THE INVENTION

This invention relates generally to automated design verification, and in particular to efficient use of binary decision diagrams to perform automated symbolic model checking for very large scale integrated circuit designs and other finite state systems.

BACKGROUND OF THE INVENTION

Modern design of very large-scale integrated circuits often involves years of research and the efforts of hundreds of engineers. Automated formal verification methods are an essential part of the design effort, reducing errors, lost time and risk to financial investment.

As the size and complexity of designs increase, much effort is expended to improve the efficiency of automated formal verification methods. One technique used in symbolic model checking to improve efficiency is to employ binary decision diagrams (BDDs). A BDD is a directed acyclic graph that represents a Boolean expression. For each Boolean variable, there are two outgoing edges representing true or false assignments to the variable. The use of BDDs permits computation times, which are some polynomial function of the number of expression variables. Alternative representations such as clauses or truth tables require execution times, which are some exponential function of the number of expression variables. Therefore, use of BDDs has been popular in the formal verification community since the late 1980's.

BDDs, however, are not without drawbacks. The ordering of variables is critical to an efficient use of BDDs. Poor variable ordering can increase a BDDs size and cause exponential execution times. One method for symbolic model checking using BDDs comes from Carnegie Mellon University and is known as Symbolic Model Verify (SMV).

Over the years, techniques have been developed to improve performance and capacity of BDD-based algorithms. One technique is called Cone of Influence (COI) reduction. In COI reduction, an abstraction is built for a circuit model consisting of next state functions only for variables in the dependency closure of variables of interest in the circuit specification. One drawback is that all variables in the dependency closure do not necessarily influence the variables of interest in the circuit specification. A second drawback is that the abstraction that is built and used for each model-checking step may include portions that are useful in only a few of the model checking steps. Therefore needless extra computations are potentially performed, resulting in little benefit to the circuit verification.

Some methods have attempted to improve upon COI reduction by starting from a small portion of the dependency closure and extending the portion only when model checking fails to produce a satisfactory result. But these techniques also perform unnecessary computations on portions that are not relevant to the particular model-checking step being performed.

One method called the bounded cone of influence (BCOI) was proposed by A. Biere et al for symbolic model checking without BDDs [A. Biere, E. Clark, R. Raimi, and Y. Zhu; Verifying safety properties of a PowerPC™ microprocessor using symbolic model checking without BDDs; CAV'99; 1999]. However, even the BCOI method potentially includes irrelevant variables in the abstraction it builds, and the technique is not applicable to improve the widely used BDD-based approaches.

BRIEF DESCRIPTION OF THE DRAWINGS

The present invention is illustrated by way of example and not limitation in the figures of the accompanying drawings.

FIG. 4b shows an example of lazy reachability analysis of a circuit.

DETAILED DESCRIPTION

These and other embodiments of the present invention may be realized in accordance with the following teachings and it should be evident that various modifications and changes may be made in the following teachings without departing from the broader spirit and scope of the invention. The specification and drawings are, accordingly, to be regarded in an illustrative rather than restrictive sense and the invention measured only in terms of the claims.

Methods for formal verification of circuits and other finite-state systems are disclosed herein, providing for improved efficiency and capacity of popular binary decision diagram (BDD) based algorithms. For one embodiment of a lazy pre-image computation, a method is disclosed that builds new transition relation partitions on-demand only for relevant next internal variables of a state predicate, and conjoins only next state relations for relevant next internal variables to a pre-image including the state predicate. For one embodiment of a lazy backward reachability analysis, a method is disclosed that makes iterative use of the lazy pre-image computation method to compute the set of states reachable to a given set of states in zero or more transitions. For one embodiment of a lazy equivalence checking, a method is disclosed that makes iterative use of the lazy pre-image computation method to compute conditions that necessarily must be satisfied to disprove equivalence. The teachings of these disclosed methods provide for symbolic model checking of circuits and other finite state systems previously too large to be completed successfully using BDD based algorithms.

Figure 1:
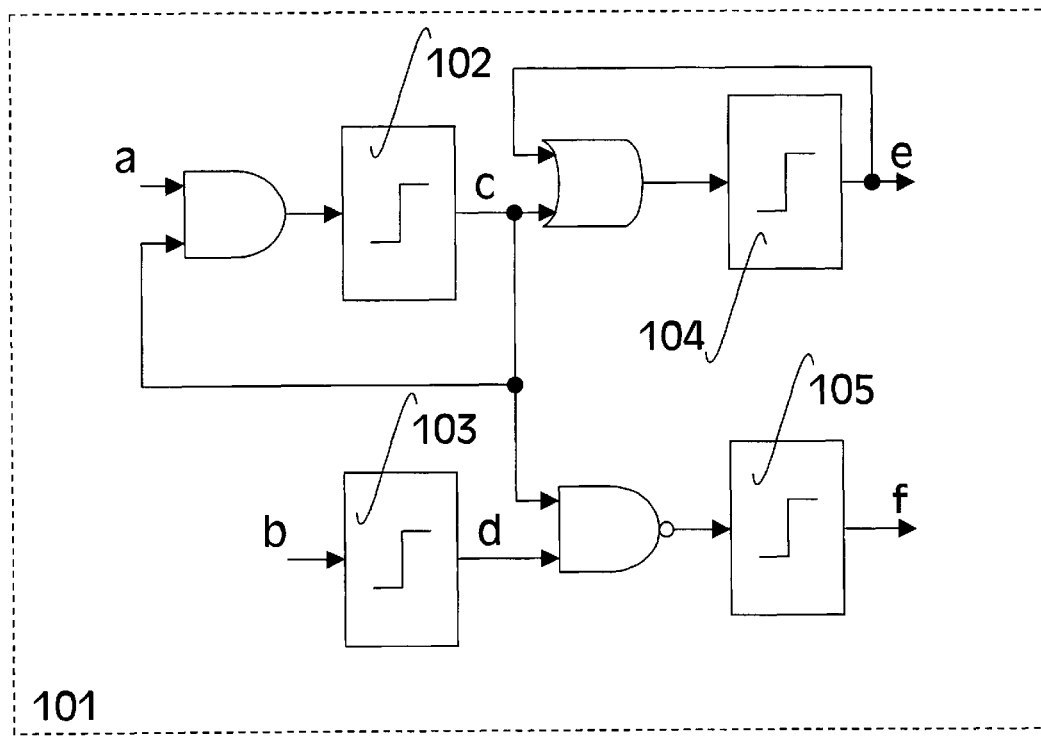
FIG. 1 illustrates an example of a circuit.

FIG. 1 illustrates an example of a circuit 101 having internal state variables c, d, e and f; and input variables a and b. According to the logical combination of inputs to memory element 102, the value of internal state variable c at its next transition can be determined to be the value of the Boolean expression a AND c. From the logical combination of inputs to memory element 103, the value of internal state variable d at its next transition can be determined to be the value of the input variable b. From the logical combination of inputs to memory element 104, the value of internal state variable e at its next transition can be determined to be the value of the Boolean expression c OR e. Finally, from the logical combination of inputs to memory element 105, the value of internal state variable f at its next transition can be determined to be the value of the Boolean expression c NAND d.

A model of a circuit or other finite state system can be formally defined as: a nonempty finite set of Boolean variables, $V=V_S \cup V_I$, consisting of a union V of internal state variables $V_S$ with input variables $V_I$; and a next state function N(v) for each v in $V_S$, which is an assignment mapping of internal state variables according to Boolean (true or false) valued expressions on V. A partitioned transition relation, R, on a partitioning of the internal state variables {V1, V2, ..., Vk} has the implicitly conjoined form:

$$R(V, V')=R1(V,V1') \text{ AND } R2(V,V2') \ldots \text{ AND } Rk(V,Vk')$$

where the ith partition is $Ri(V,Vi')=\text{AND}_{for\ all\ v'\ in\ Vi'} (v'=N(v))$. The assertion v'=N(v) is called the next state relation for v and v' is a copy of v to record the value taken on by v at the next transition.

A set of states, S, may be represented using a Boolean state predicate S(V). Operations on sets may be carried out as algebraic manipulations of state predicates. The set of states that can move to S in one transition is called the pre-image of S and written $$\text{Pre}(S(V))=\exists V'\cdot[\text{AND}_{for\ all\ v'\ in\ Vs'}(v'=N(v)) \text{ AND } S(V')].$$

An operation ∃V'·[S(V')] represents a quantification of state predicate S(V') over the variables in V'. Typically, in order to more efficiently use computation resources, the operation of computing the pre-image of a set of states is carried out as a relation product of state predicates using early variable quantification for partitioned transition relations, thereby permitting staged reductions of Boolean expressions, as follows:

```
Pre(S(V)) =  ∃V1'.[R1(V,V1') AND (
             ∃V2'.[R2(V,V2') AND (
             ...
             ∃Vk.[Rk(V,Vk') AND (
             ∃VI'.S(V') )]
             ... 0]
             )].
```

One drawback of a typical pre-image computation is that it involves the entire partitioned transition relation. But S(V) may involve only a few variables. Consequently, not all next state relations are relevant in any particular invocation of a pre-image computation.

Figure 2A:
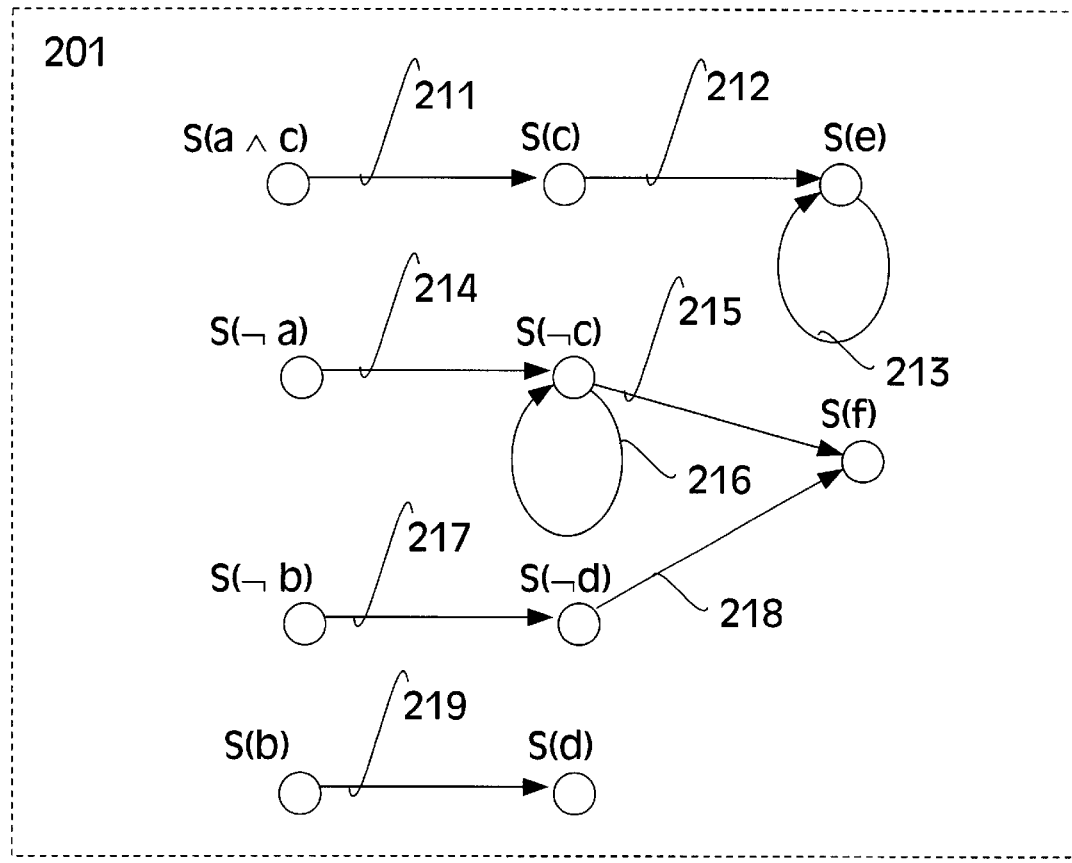
FIG. 2a graphically illustrates a transition relation for a circuit.

For example, FIG. 2a graphically illustrates a possible transition relation 201 for circuit 101 having $V_S=\{c, d, e, f\}$ and $V_I=\{a, b\}$. The next state function for variable c is N(c)=a AND c. Therefore, in order for the circuit to reach a state, S(c), where c=1 it must have made transition 211 from a state S(a AND c) where a=1 and c=1. The next state function for variable d is N(d)=b. Therefore, in order for the circuit to reach a state, S(d), where d=1 it must have made transition 219 from a state S(b) where b=1. The next state function for variable e is N(e)=e OR c. Therefore, in order for the circuit to reach a state, S(e), where e=1 it must have made transition 212 from a state S(c) where c=1 or it must have made transition 213 from a state S(e) where e=1. The next state function for variable f is N(f)=d NAND c. Therefore, in order for the circuit to reach a state, S(f), where f=1 it must have made transition 215 from a state S(NOT c) where c=0 or it must have made transition 218 from a state S(NOT d) where d=0.

Computing all states reachable to S(e) in two or more transitions includes the next state function for variable c, which has already been shown as N(c)=a AND c represented by transition 211. The next state function for variable NOT c is N(NOT c)=NOT(a AND c)=(NOT a) OR (NOT c). Therefore, in order for the circuit 101 to reach a state, S(NOT c), where c=0 it must have made transition 214 from a state S(NOT a) where a=0 or it must have made transition 216 from a state S(NOT c) where c=0. The next state function for variable NOT d is N(NOT d)=NOT b. Therefore, in order for the circuit to reach a state, S(NOT d), where d=0 it must have made transition 217 from a state S(NOT b) where b=0.

For a given state predicate, an invocation of a pre-image computation that uses transition relation 201 may result in computations that are not relevant to that state predicate. For one embodiment, a lazy pre-image computation is disclosed which provides a relevant transition relation abstraction for each pre-image computation according to the state predicate of the invocation. Such a lazy pre-image computation may be performed for a state predicate S(W), where W is contained in V and $W_S'$ is the set of next internal variables in the set of next variables W', as follows:

$$\text{Pre}(S(W))=\exists W'\cdot[\text{AND}_{for\ all\ v'\ in\ Ws'}(v'=N(v)) \text{ AND } S(W')].$$

The approach provided by the lazy pre-image computation disclosed above differs from previous COI reduction approaches in that it is not statically derived from a model specification and then used throughout. Instead, it dynamically provides an abstraction for each pre-image computation that is relevant to the particular state predicate associated with the invocation. Accordingly, lazy pre-image computation provides for greater efficiency and capacity improvements in popular BDD-based symbolic model checking methods than previously used pre-image computation methods.

For example, the lazy pre-image of a state predicate S(e) for circuit 101 where e=1 can be computed:

```
Pre(S(e))  =∃e'.[(e'=N(e)) AND S(e')].
           =∃e'.[(e'=e OR c) AND e'].
           =(e OR c).
```

Figure 2B:
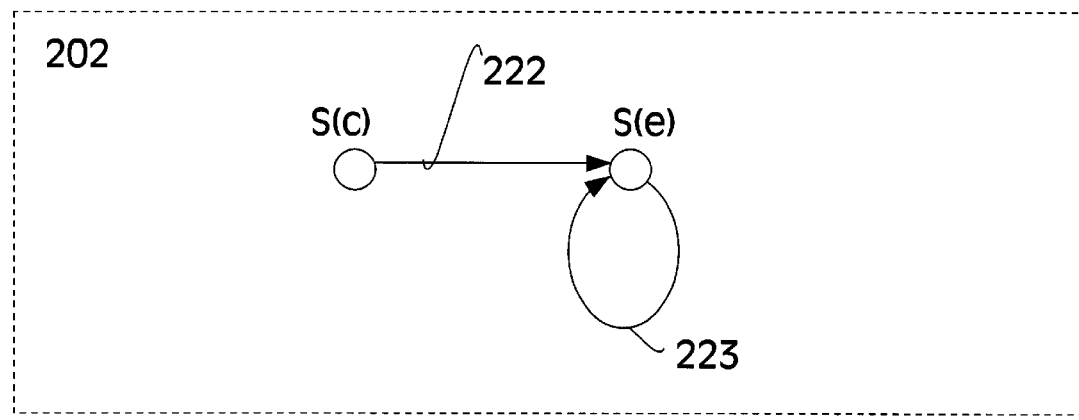
FIG. 2b shows another transition relation built as part of a lazy pre-image computation.

FIG. 2b graphically illustrates a possible transition relation 202 for circuit 101 built as a result of an invocation of the lazy pre-image computation Pre(S(e)) on the state predicate S(e) where e=1. The next state function for variable e is N(e)=e OR c. Therefore, in order for the circuit to reach a state, S(e), where e=1 it must have made transition 222 from a state S(c) where c=1 or it must have made transition 223 from a state S(e) where e=1. Since no other transitions are relevant to reaching state S(e), the lazy pre-image method need not build them. As seen in the above example, this lazy pre-image method potentially reduces the number of transition relation partitions involved and also the sizes of partitions. Therefore computations required to explicitly build a BDD for a desired function may be significantly reduced.

Figure 3A:
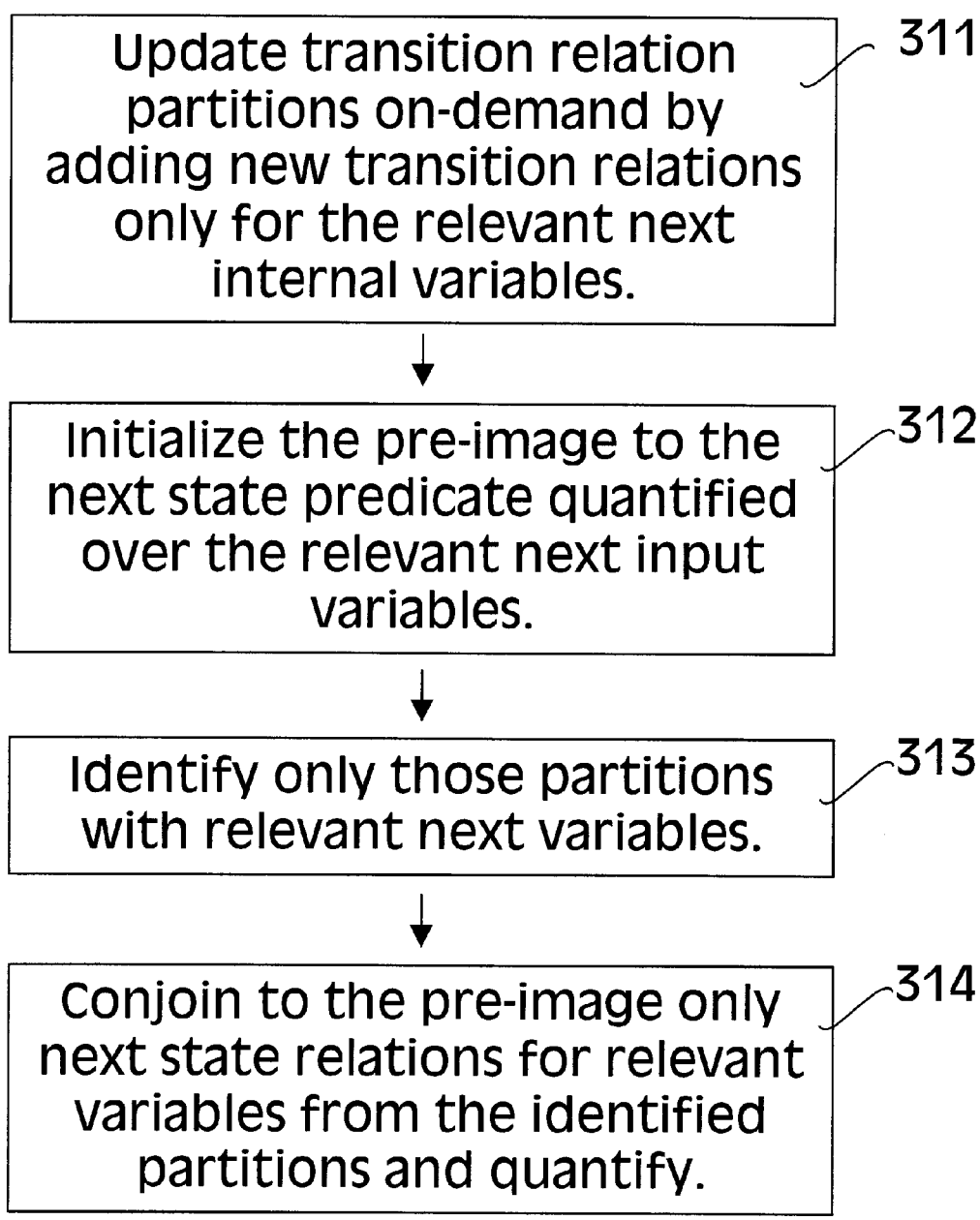
FIG. 3a illustrates one embodiment of a method for performing lazy pre-image computations.

For one embodiment, FIG. 3a illustrates performing a lazy pre-image computation. In processing block 311 transition relation partitions are updated as needed by adding new transition relations for only the relevant next internal variables. In processing block 312 a pre-image is initialized to the next state predicate of the invocation and existentially quantified over the relevant next input variables. In processing block 313, partitions with relevant next variables are identified. Finally in processing block 314, next state relations for relevant variables from the partitions identified in processing block 313 are conjoined to the pre-image and quantified.

The lazy pre-image method disclosed above provides for greater efficiency and capacity for symbolic model checking operations, particularly on circuits with a large number of variables. In a BDD based implementation, building transition relation partitions only as needed and only for relevant next internal variables is especially beneficial since the next state function for an internal variable is efficiently and implicitly encoded, but a BDD for the function must be explicitly built for symbolic model checking. Explicitly building BDDs unnecessarily may become computationally expensive.

Figure 3B:
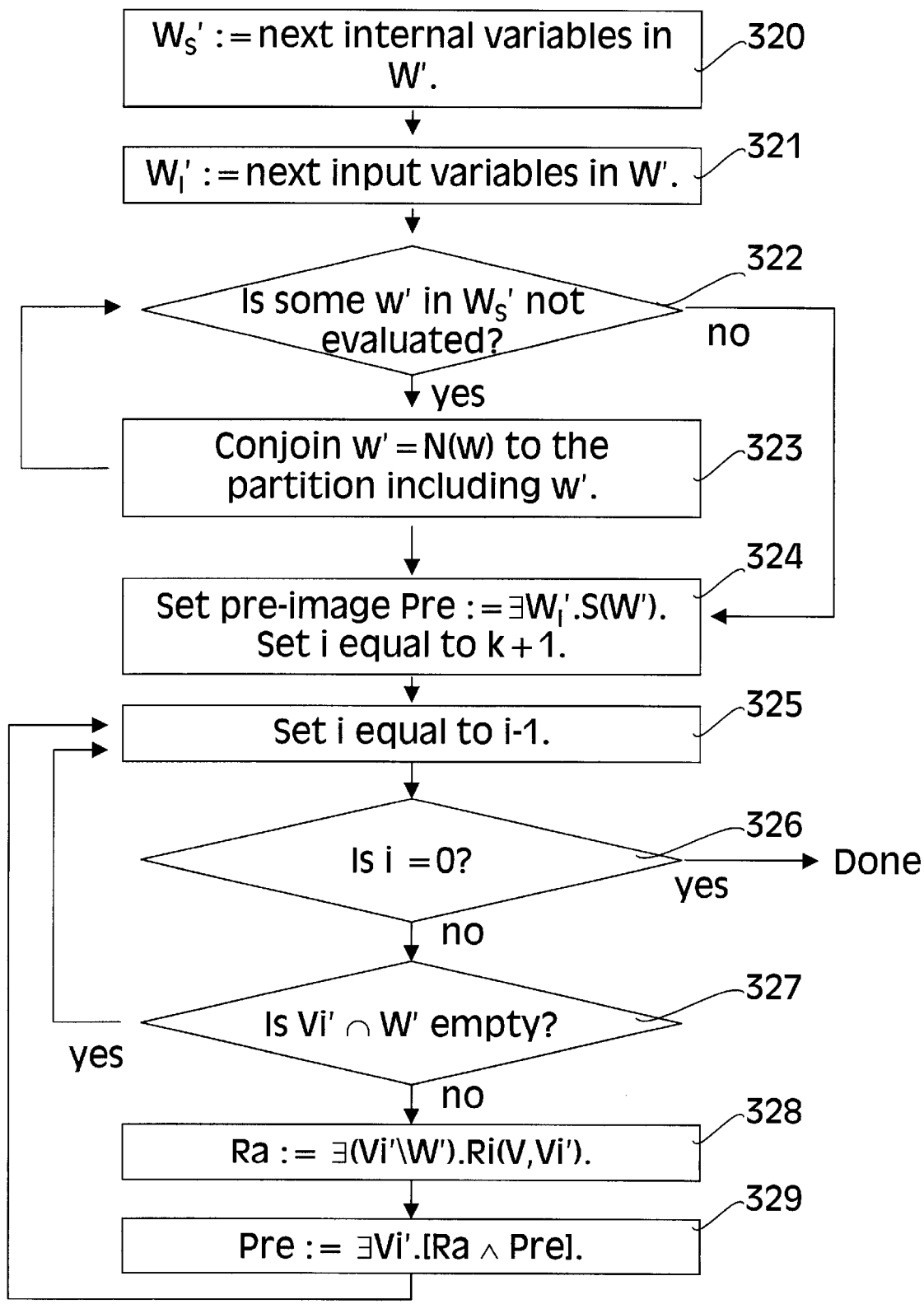
FIG. 3b illustrates one embodiment of a more detailed method for performing lazy pre-image computations.

For one embodiment, FIG. 3b details a method for performing a lazy pre-image computation on a state predicate S(W) involving a set W of internal variables and input variables. In processing block 320, $W_S'$ is initialized to be the set of next internal variables in W'. In processing block 321, $W_I'$ is initialized to be the set of next input variables in W'. In processing block 322, the next internal variables are checked to identify some variable w' that has not been evaluated. If one is identified, w'=N(w) is conjoined to the partition including w' and flow returns to processing block 322 to look for more next variables that have not been evaluated. Thus the transition relation partitions are built as needed for the relevant next internal variables. When no more are found, flow proceeds at processing block 324. In processing block 324 the pre-image is initialized to the state predicate existentially quantified for the relevant next input variables and partition counter i is set to k+1. In processing block 325, i is decremented. Then in processing block 326, partition counter i is tested to see if it has reached zero. If partition counter i has not reached zero, in processing block 327 partition Vi' is checked against W' to identify relevant variables. If no relevant variables are found, partition Vi' is skipped and flow proceeds at processing block 325. Otherwise in processing block 328, all next variables in Vi' that are not in W' are existentially quantified out from partition Vi' and the remaining relevant variables are evaluated according to their next state relations and assigned to Ra. Then in processing block 329, Ra is conjoined with the pre-image Pre and flow proceeds with the next i at processing block 325. When i=0 indicating no more partitions remain at processing block 326, the processing terminates and pre-image Pre is complete.

For one embodiment, the lazy pre-image computation disclosed above provides for potential improvements in key model checking techniques. For example, backward reachability analysis is a technique to compute the set of states reachable to a given set of states in zero or more transitions. Backward reachability analysis can be accomplished through iterations of the lazy pre-image computation, thereby benefiting from any efficiency and capacity improvements.

Figure 4A:
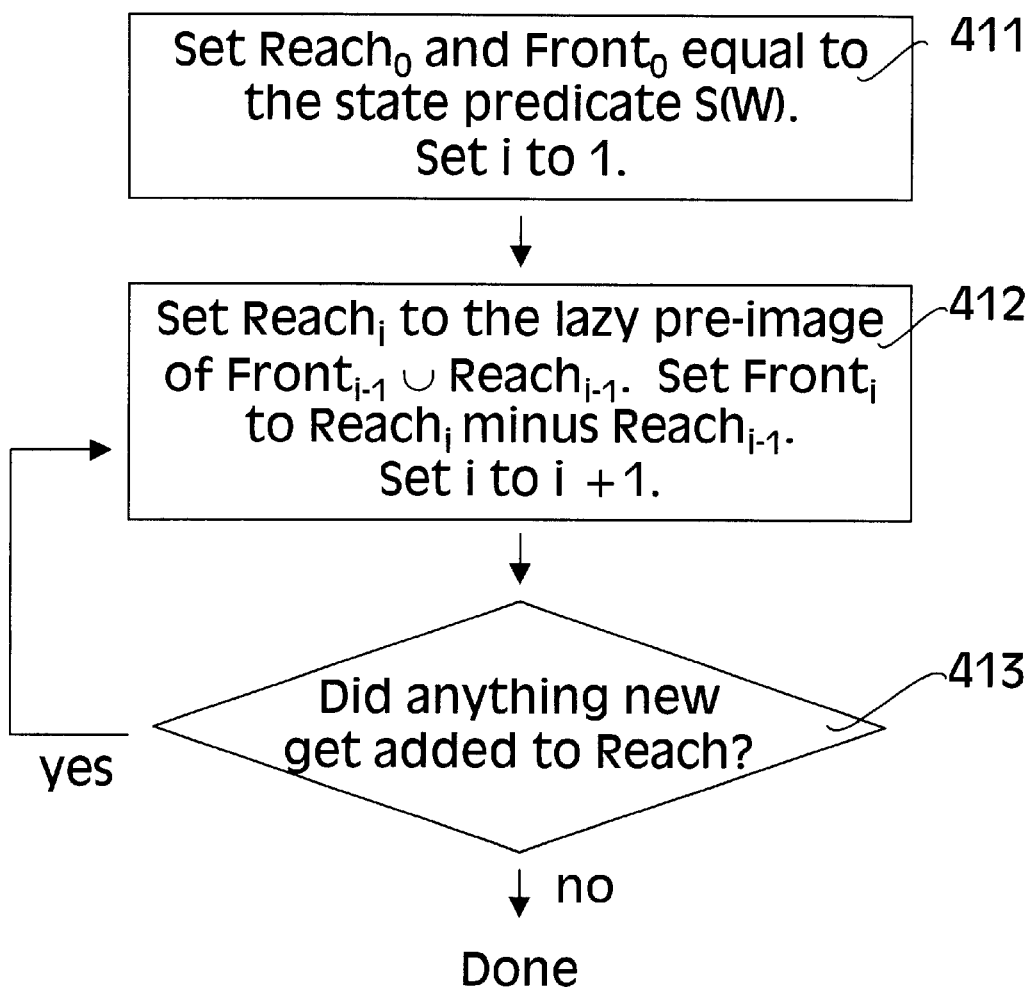
FIG. 4a illustrates one embodiment of a method for performing lazy reachability analysis using lazy pre-image computations.

For one embodiment, FIG. 4a illustrates lazy reachability analysis, which uses lazy pre-image computations. In processing block 411, the set of states reachable to state predicate S(W) in zero transitions, $Reach_0$, and the frontier predicate, $Front_0$, are both set to S(W), and counter i is initialized to 1. In processing block 412, the set of states reachable to S(W) in i transitions, $Reach_i$, is set to the lazy pre-image of the set of states reachable to S(W) in i−1 transitions, Pre($Front_{i-1}$ ∪ $Reach_{i-1}$). The frontier predicate $Front_0$ is set to the difference between the states in $Reach_i$ and the states in $Reach_{i-1}$. Counter i is then incremented. In processing block 413, Reach is tested to see if any new states were added in the previous iteration. If so, processing block 412 repeats until Reach does not change in which case processing terminates at processing block 413.

For one embodiment, FIG. 4b illustrates an example of performing lazy reachability analysis for state predicate, S(e), where e=1, on circuit 101. The state predicate 420 for the states reachable to S(e) in zero transitions is initially set to e. Since no pre-image computation is required, no transition relation is built. To compute the state predicate 421 for the states reachable to S(e) in one transition a lazy pre-image of the state predicate 420 is computed. Since predicate 420 only involves signal e, lazy transition relation building only computes a transition relation partition for e, as [N(e)=e OR c]. Pre(S(e)) can be computed as previously shown, and the lazy pre-image computation returns e OR c based on the partially computed transition relation. Predicate 421 for states reachable S(e) in one transition becomes e OR c.

To compute the state predicate 422 for those states reachable to S(e) in two transitions, the pre-image of e OR c is computed:

Pre(e OR c)   =∃e', c'.[(e'=N(e)) AND (c'=N(c)) AND S(e', c')].
              =∃e', c'.[(e'=e OR c) AND (c'=c AND a) AND (e'OR c')].
              =(e OR c) OR (c AND a).

Alternatively, since Pre(e) has already been computed, what needs to be computed is Pre(c). The reduction of the frontier may be accomplished through use of a variable reduction technique prior to computing the subsequent pre-image. Predicate e OR c requires lazy transition relation building of the translation relation partition for c, as [N(c)=c AND a]. Lazy pre-image computation returns (e OR c) OR (c AND a) based on the partially computed transition relation. Predicate 422 for states reachable to S(e) in two transitions becomes (e OR c) OR (c AND a), which can be reduced algebraically to just e OR c.

Since nothing new was added, state predicate 423 for those states reachable to S(e) in three transitions remains e OR c and reachability analysis terminates. The transition relations for b, d and f are not needed and therefore they are not built.

For one embodiment of the lazy pre-image computation disclosed above also provides for potential improvements in a key model checking technique known as equivalence checking. Checking the equivalence of two internal variables, y and z, having values produced by two different circuits can be accomplished through expressing a state predicate S(y, z)=(y≠z) and performing reachability analysis through iterations of the lazy pre-image computation, thereby benefiting from any efficiency and capacity improvements. The set of reachable states is checked to see if it contains an initial state involving input variables. If an assignment of input variables satisfies the predicate for reachable states then a counterexample to the variables' equivalence has been produced.

For example, in zero transitions a counterexample of the equivalence of variables e and f from circuit 101 is simply (e≠f). In the first iterative step equivalence checking of variables e and f after one transition can be computed as follows:

Pre(e ≠ f)　　=∃e', f.[(e'=N(e)) AND (f=N(f)) AND S(e', f)].
　　　　　　=∃e', f.[(e'=e OR c) AND (f=c NAND d) AND (e' ≠ f)].
　　　　　　=((e OR c) ≠ (c NAND d)).

Equivalence checking of variables e and f after two transition can be computed as follows:

Pre((e OR c) ≠ (c NAND d)) =
. ∃e', c', d'.[(e'=N(e)) AND (c'=N(c)) AND (d'=N(d)) AND S(e', c', d')].
. =∃e', c', d'.[(e'=e OR c) AND (c'=c AND a) AND (d'=b) AND
　　　　　　((e' OR c') ≠ (c' NAND d'))].
. =((e OR c) OR (c AND a)) ≠ ((c AND a) NAND b)).

If the pre-image can be satisfied by some assignment of variables, then variables e and f are not equivalent. For example assigning a value of zero to all variables in the above pre-image satisfies the expression. Therefore, variables e and f are not equivalent.

Figure 5:
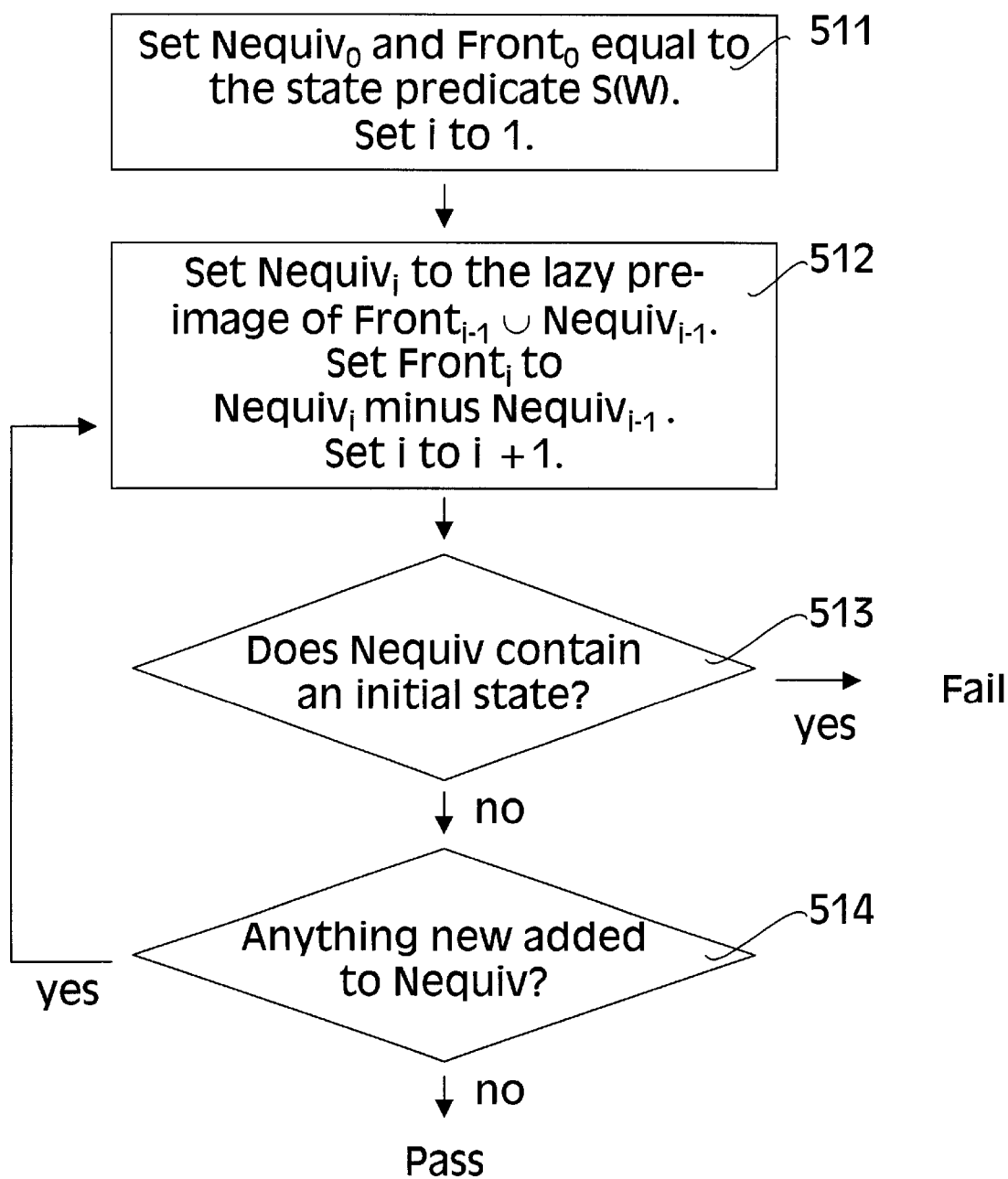
FIG. 5 illustrates one embodiment of a method for performing lazy equivalence checking using lazy pre-image computations.

For one embodiment, FIG. 5 illustrates equivalence checking, which uses lazy pre-image computations. In processing block 511, the condition to disprove equivalence, $Nequiv_0$, of two variables w1 and w2, for zero transitions, and the frontier predicate, $Front_0$, are both set to the state predicate S(W)=(w1≠w2), and counter i is initialized to 1. In processing block 512, the condition to disprove equivalence, $Nequiv_i$, is set to the lazy pre-image of the state predicate formed by a union of the frontier with the previously computed condition to disprove equivalence, $Pre(Front_{i-1} \cup Nequiv_{i-1})$. The frontier predicate $Front_0$ is set to the difference between the states in $Nequiv_i$ and the states in $Nequiv_{i-1}$. Counter i is then incremented. In processing block 513, Nequiv is tested to see if the condition produced contains an initial state involving input variables that can be satisfied. If so an equivalence counterexample has been identified meaning that the variables w1 and w2 are not equivalent and the processing terminates at processing block 513. Otherwise in processing block 514, Nequiv is tested to see if new reachable states have been added. If so, processing block 512 repeats until Nequiv represents a fixpoint in which case the processing terminates at processing block 514 and the two variables are equivalent.

It will be appreciated that lazy pre-image computations require next state relations only for the variables in the state predicate. Alternatively, a COI reduction method would use the entire model in every pre-image computation. It will be also appreciated that the methods herein disclosed or methods substantially similar to those herein disclosed may be implemented in one of many programming languages for performing automated computations including but not limited to lazy pre-image computations, lazy reachability analysis, lazy equivalence checking, and lazy model checking using high-speed computing devices.

Figure 6:
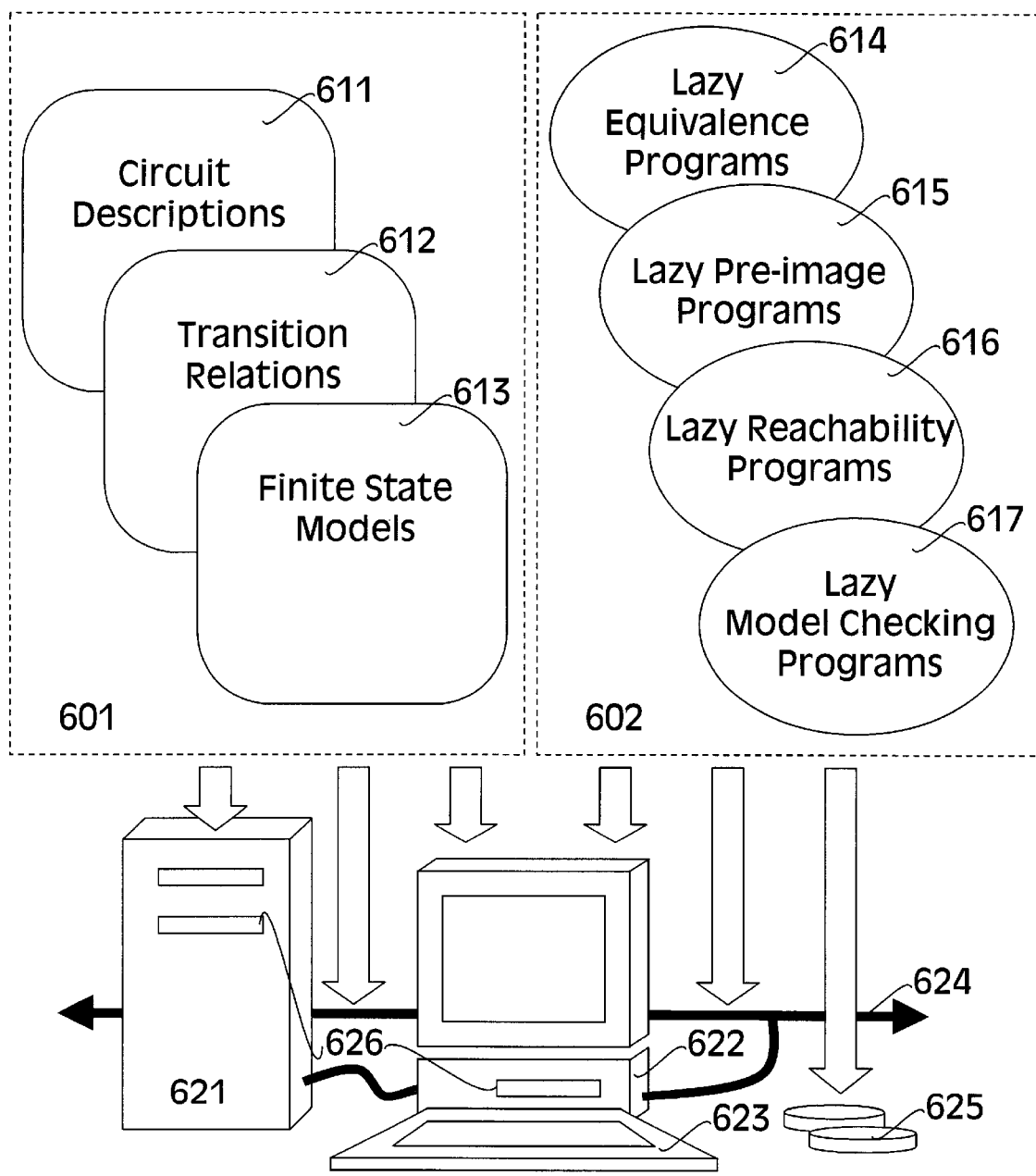
FIG. 6 depicts a computing system for automated lazy symbolic model checking of finite state systems.

For example, FIG. 6 illustrates a computer system to perform computations, for one such embodiment. Processing device 622 is connectable with various recordable storage media, transmission media and I/O devices to receive data structures and programmed methods. Representative data structures 601 may include circuit descriptions 611, transition relations 612, and finite state models 613. Representative programmed methods 602 may include lazy equivalence programs 614, lazy pre-image programs 615, lazy reachability programs 616, and model checking programs 617. Components of either or both of the data structures and programmed methods may be stored or transmitted on recordable media such as removable storage disks 625, which may be accessed through an access device 626 in processing device 622 or in a storage serving system 621. Storage serving system 621 or processing device 622 may also include other removable storage media or non-removable storage media suitable for storing or transmitting data structures 601 or programmed methods 602. Component data structures and programmed methods may also be stored or transmitted on transmission media such as network 624 for access by processing device 622 or entered by users through I/O device 623. It will be appreciated that systems such as the one illustrated are commonly available and widely used in the art of designing finite state hardware and software systems. It will also be appreciated that the complexity, capabilities, and physical forms of such design systems improves and changes rapidly, and therefore understood that the design system illustrated is by way of example and not limitation.

The above description is intended to illustrate preferred embodiments of the present invention. From the discussion above it should also be apparent that the invention can be modified in arrangement and detail by those skilled in the art without departing from the principles of the present invention within the scope of the accompanying claims.

What is claimed is:

1. A computer software product having one or more recordable medium having executable instructions stored thereon which, when executed by a processing device, causes the processing device to:

identify a next internal variable in a state predicate of a pre-image calculation;

build a first next state relation for a first transition relation partition to include the identified next internal variable; and conjoin the first next state relation of the identified next internal variable to a pre-image including the state predicate.

2. The computer software product recited in claim 1 which, when executed by a processing device, further causes the processing device to:

identify in a second transition relation partition a second internal variable of the state predicate; and conjoin a second next state relation of the second internal variable to a pre-image including the state predicate.

3. The computer software product recited in claim 2 which, when executed by a processing device, further causes the processing device to:

identify in a third transition relation partition a third internal variable not of the state predicate; and quantify the third internal variable out of the third transition relation partition prior to conjoining the pre-image including the state predicate.

4. The computer software product recited in claim 1 which, when executed by a processing device, further causes the processing device to:

set the state predicate equal to a second predicate representing a second set of states reachable to a first set of states in zero or more transitions.

5. The computer software product recited in claim 4 which, when executed by a processing device, further causes the processing device to:

set the second predicate equal to a pre-image representing a third set of states reachable to the first set of states in zero or more transitions.

6. The computer software product recited in claim 1 which, when executed by a processing device, further causes the processing device to:

set the state predicate equal to a second predicate representing an equivalence relationship for a plurality of variables.

7. The computer software product recited in claim 6 which, when executed by a processing device, further causes the processing device to:

identify an equivalence counterexample in the pre-image including the state predicate.

8. A computer software product having one or more recordable medium having executable instructions stored thereon which, when executed by a processing device, causes the processing device to:

identify in a transition relation partition a first internal variable of a state predicate of a pre-image calculation;

identify in the transition relation partition a second internal variable not of the state predicate; and conjoin a first next state relation for the first internal variable but not for the second internal variable to a pre-image including the state predicate.

9. The computer software product recited in claim 8 wherein the second internal variable is quantified out of the transition relation partition prior to conjoining the pre-image including the state predicate.

10. The computer software product recited in claim 8 which, when executed by a processing device, further causes the processing device to:

identify a next internal variable in the state predicate;

build a transition relation partition including a next state relation for the identified internal variable.

11. The computer software product recited in claim 8 which, when executed by a processing device, further causes the processing device to:

set the state predicate equal to a second predicate representing a second set of states reachable to a first set of states in zero or more transitions.

12. The computer software product recited in claim 11 which, when executed by a processing device, further causes the processing device to:

set the second predicate equal to a pre-image representing a third set of states reachable to the first set of states in zero or more transitions.

13. The computer software product recited in claim 8 which, when executed by a processing device, further causes the processing device to:

set the state predicate equal to a predicate representing an equivalence relationship for a plurality of variables.

14. The computer software product recited in claim 13 which, when executed by a processing device, further causes the processing device to:

identify an equivalence counterexample in the pre-image including the state predicate.

15. A method comprising:

identifying a next internal variable in a state predicate of a pre-image calculation;

building a transition relation including a first next state relation for the identified internal variable; and conjoining the first next state relation for the identified internal variable to a pre-image including the state predicate.

16. The method recited in claim 15 further comprising:

identifying in a second transition relation partition a second internal variable of the state predicate; and conjoining a second next state relation for the second internal variable to a pre-image including the state predicate.

17. The method recited in claim 16 further comprising:

identifying in a third transition relation partition a third internal variable not of the state predicate; and quantifying the third internal variable out of the transition relation partition prior to conjoining the pre-image including the state predicate.

18. The method recited in claim 15 further comprising:

setting the state predicate equal to a second predicate representing a second set of states reachable to a first set of states in zero or more transitions.

19. The method recited in claim 18 further comprising:

setting the second predicate equal to a pre-image representing a third set of states reachable to the first set of states in zero or more transitions.

20. The method recited in claim 15 further comprising:

setting the state predicate equal to a second predicate representing an equivalence relationship for a plurality of variables.

21. The method recited in claim 20 further comprising:

identifying an equivalence counterexample in the pre-image including the state predicate.

22. A method comprising:

identifying in a transition relation partition a first internal variable of a state predicate;

identifying in the transition relation partition a second internal variable not of the state predicate; and conjoining a first next state relation for the first internal variable but not for the second internal variable to a pre-image including the state predicate.

23. The method recited in claim 22 wherein the second internal variable is quantified out of the transition relation partition prior to conjoining the pre-image including the state predicate.

24. The method recited in claim 22 further comprising:

identifying a next internal variable in the state predicate;

building a transition relation including a second next state relation for the identified internal variable.

25. The method recited in claim 22 further comprising:

setting the state predicate equal to a second predicate representing a second set of states reachable to a first set of states in zero or more transitions.

26. The method recited in claim 25 further comprising:

setting the second predicate equal to a pre-image representing a third set of states reachable to the first set of states in zero or more transitions.

27. The method recited in claim 22 further comprising:

setting the state predicate equal to a second predicate representing an equivalence relationship for a plurality of variables.

28. The method recited in claim 27 further comprising:

identifying an equivalence counterexample in the pre-image including the state predicate.

29. A computer software product having one or more recordable medium having executable instructions stored thereon which, when executed by a processing device, causes the processing device to:

access a next state relation N and a set of next variables W' that contains a set of next internal variables Ws'; and compute a pre-image Pre(S(W)) of a state predicate S(W) involving a set of variables W according to a logical relation equivalent to or including $$Pre(S(W)) = \exists W' \cdot [AND_{for\ all\ v'\ in\ Ws'}(v' = N(v))\ AND\ S(W')].$$

30. A formal verification method using a next state relation N and a set of next variables W' that contains a set of next internal variables Ws', to compute a pre-image Pre(S(W)) of a state predicate S(W) involving a set of variables W according to a logical relation equivalent to or including:

$$Pre(S(W)) = \exists W' \cdot [AND_{for\ all\ v'\ in\ Ws'}(v' = N(v))\ AND\ S(W')].$$

31. A verification system comprising:
    means for identifying a next internal variable in a state predicate of a pre-image calculation;
    means for building a transition relation including a first next state relation for the identified internal variable; and
    means for conjoining the first next state relation for the identified internal variable to a pre-image including the state predicate.

32. The verification system of claim 31 further comprising:
    means for identifying in a second transition relation partition a second internal variable of the state predicate; and
    means for conjoining a second next state relation for the second internal variable to a pre-image including the state predicate.

33. The verification system of claim 32 further comprising:
    means for identifying in a third transition relation partition a third internal variable not of the state predicate; and
    means for quantifying the third internal variable out of the transition relation partition prior to conjoining the pre-image including the state predicate.

34. The verification system of claim 31 further comprising:
    means for setting the state predicate equal to a second predicate representing a second set of states reachable to a first set of states in zero or more transitions.

35. The verification system of claim 34 further comprising:
    means for setting the second predicate equal to a pre-image representing a third set of states reachable to the first set of states in zero or more transitions.

36. The verification system of claim 31 further comprising:
    means for setting the state predicate equal to a second predicate representing an equivalence relationship for a plurality of variables.

37. The verification system of claim 36 further comprising:
    means for identifying an equivalence counterexample in the pre-image including the state predicate.

38. A verification system comprising:
    means for identifying in a transition relation partition a first internal variable of a state predicate;
    means for identifying in the transition relation partition a second internal variable not of the state predicate; and
    means for conjoining a first next state relation for the first internal variable but not for the second internal variable to a pre-image including the state predicate.

39. The verification system of claim 38 wherein the second internal variable is quantified out of the transition relation partition prior to conjoining the pre-image including the state predicate.

40. The verification system of claim 38 further comprising:
    means for identifying a next internal variable in the state predicate;
    means for building a transition relation including a second next state relation for the identified internal variable.

41. The verification system of claim 38 further comprising:
    means for setting the state predicate equal to a second predicate representing a second set of states reachable to a first set of states in zero or more transitions.

42. The verification system of claim 41 further comprising:
    means for setting the second predicate equal to a pre-image representing a third set of states reachable to the first set of states in zero or more transitions.

43. The verification system of claim 38 further comprising:
    means for setting the state predicate equal to a second predicate representing an equivalence relationship for a plurality of variables.

44. The verification system of claim 43 further comprising:
    means for identifying an equivalence counterexample in the pre-image including the state predicate.

45. A verification system comprising:
    a recordable medium to store executable instructions;
    a processing device to execute executable instruction; and
    a plurality of executable instructions to cause the processing device to:
    identify a next internal variable in a state predicate of a pre-image calculation;
    build a next state relation for a first transition relation partition to include the identified internal variable; and
    conjoin the first next state relation of the identified internal variable to a pre-image including the state predicate.

46. A verification system comprising:
    a recordable medium to store executable instructions;
    a processing device to execute executable instruction; and
    a plurality of executable instructions to cause the processing device to:
    identify in a transition relation partition a first internal variable of a state predicate of a pre-image calculation;
    identify in the transition relation partition a second internal variable not of the state predicate; and
    conjoin a first next state relation for the first internal variable but not for the second internal variable to a pre-image including the state predicate.

* * * * *

UNITED STATES PATENT AND TRADEMARK OFFICE
CERTIFICATE OF CORRECTION

PATENT NO. : 6,725,431 B1
DATED : April 20, 2004
INVENTOR(S) : Yang

It is certified that error appears in the above-identified patent and that said Letters Patent is hereby corrected as shown below:

<u>Column 3,</u>
Line 48, delete "0]" and insert -- )] --.

<u>Column 11,</u>
Line 15, between "W' " and "[AND", delete "-" and insert -- . --.

Signed and Sealed this

Sixth Day of July, 2004

JON W. DUDAS
*Acting Director of the United States Patent and Trademark Office*